(12) United States Patent
Choi

(10) Patent No.: US 8,878,600 B1
(45) Date of Patent: Nov. 4, 2014

(54) INTERNAL VOLTAGE GENERATION CIRCUITS

(71) Applicant: SK Hynix Inc., Icheon-si (KR)

(72) Inventor: Min Seok Choi, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/134,271

(22) Filed: Dec. 19, 2013

(30) Foreign Application Priority Data

Aug. 16, 2013 (KR) .................. 10-2013-0097290

(51) Int. Cl.
*G05F 1/10* (2006.01)
*G05F 3/02* (2006.01)
*H03K 17/22* (2006.01)

(52) U.S. Cl.
CPC ........ *H03K 17/22* (2013.01); *H03K 2217/0081* (2013.01)
USPC ......................................... 327/538; 365/226

(58) Field of Classification Search
USPC .................................. 327/530, 538; 365/226
See application file for complete search history.

(56) References Cited

U.S. PATENT DOCUMENTS

| 2005/0122820 A1* | 6/2005 | Choi et al. .................... 365/226 |
| 2011/0095814 A1* | 4/2011 | Kim et al. ..................... 327/538 |
| 2013/0142000 A1* | 6/2013 | Lee et al. ...................... 365/226 |

FOREIGN PATENT DOCUMENTS

| KR | 1020080065142 A | 7/2008 |
| KR | 1020100130398 A | 12/2010 |

* cited by examiner

*Primary Examiner* — Quan Tra
(74) *Attorney, Agent, or Firm* — William Park & Associates Patent Ltd.

(57) ABSTRACT

An internal voltage generation circuit includes a flag signal generator suitable for generating a first flag signal which is enabled after a first predetermined time from a moment that a deep power-down mode terminates and suitable for generating a second flag signal which is enabled after a second predetermined time from a moment that the first flag signal is enabled, a drive signal generator suitable for receiving the first and second flag signals to generate a first drive signal and a second drive signal and suitable for receiving a pre-oscillation signal in response to the first and second flag signals to generate a third drive signal and a fourth drive signal, and an internal voltage generator suitable for driving a first internal voltage signal in response to the first and second drive signals and suitable for pumping a second internal voltage signal in response to the third and fourth drive signals.

20 Claims, 8 Drawing Sheets

INTERNAL VOLTAGE GENERATION CIRCUITS

CROSS-REFERENCE TO RELATED APPLICATION

The present application claims priority under 35 U.S.C. 119(a) to Korean Application No. 10-2013-0097290, filed on Aug. 16, 2013, in the Korean Intellectual Property Office, which is incorporated herein by reference in its entirety as set forth in full.

BACKGROUND

1. Technical Field

Embodiments of the present disclosure generally relate to semiconductor integrated circuits and, more particularly, to internal voltage generation circuits.

2. Related Art

In general, semiconductor devices receive a power supply voltage VDD and a ground voltage VSS from an external system to generate internal voltages used in operations of internal circuits thereof. The internal voltages for operating the internal circuits of the semiconductor devices may include a core voltage VCORE supplied to core regions, a high voltage VPP used to drive or overdrive word lines, and a low voltage VBB applied to a bulk region (or a substrate) of NMOS transistors in the core region.

The core voltage VCORE may be a positive voltage which is lower than the power supply voltage VDD supplied from the external system. Thus, the core voltage VCORE may be generated by lowering the power supply voltage VDD to a certain level. In contrast, the high voltage VPP may be higher than the power supply voltage VDD, and the low voltage VBB may be a negative voltage which is lower than the ground voltage VSS. Thus, charge pump circuits may be required to generate the high voltage VPP and the low voltage VBB.

The semiconductor devices, for example, dynamic random access memory (DRAM) devices may be designed to operate at a high speed with low power consumption and large cell capacitance. Thus, most semiconductor devices may be designed to have a deep power-down mode that minimizes a driving current when a data input/output (I/O) operation is not executed. If the semiconductor devices enter the deep power-down mode, internal voltage generation circuits for generating the internal voltages may be turned off to stop generation of the internal voltages.

However, if the deep power-down mode of the semiconductor device terminates, all the internal voltage generation circuits may be turned on to abruptly increase the driving current of the semiconductor device. As a result, a level of the power supply voltage VDD may be suddenly lowered. That is, the power consumption of the semiconductor device may be abruptly increased. In such a case, another semiconductor device sharing the power supply voltage VDD with the semiconductor device may malfunction due to the lowered power supply voltage VDD.

SUMMARY

Various embodiments are directed to internal voltage generation circuits.

According to some embodiments, an internal voltage generation circuit includes a flag signal generator suitable for generating a first flag signal which is enabled after a first predetermined time from a moment that a deep power-down mode terminates and suitable for generating a second flag signal which is enabled after a second predetermined time from a moment that the first flag signal is enabled, a drive signal generator suitable for receiving the first and second flag signals to generate a first drive signal and a second drive signal and suitable for receiving a pre-oscillation signal in response to the first and second flag signals to generate a third drive signal and a fourth drive signal, and an internal voltage generator suitable for driving a first internal voltage signal in response to the first and second drive signals and suitable for pumping a second internal voltage signal in response to the third and fourth drive signals.

According to further embodiments, an internal voltage generation circuit includes an internal oscillation signal generator, a selection signal generator, a latch unit, and a drive signal generator. The internal oscillation signal generator receives a deep power-down signal for executing a deep power-down mode to generate an internal oscillation signal including pulses which are periodically created. The selection signal generator outputs a counted signal as a first selection signal and outputs the counted signal as a second selection signal after the first selection signal is outputted. Further, the selection signal generator outputs the counted signal as a third selection signal after the second selection signal is outputted and outputs the counted signal as a fourth selection signal after the third selection signal is outputted. The counted signal is generated when the number of the pulses of the internal oscillation signal inputted to the selection signal generator is equal to a predetermined number. The latch unit latches the first to fourth selection signals to generate first to fourth flag signals after the deep power-down mode terminates. The drive signal generator receives the first to fourth flag signals to generate first to fourth drive signals for generating a first internal voltage signal and receives the first to fourth flag signals to generate fifth to eighth drive signals for pumping a second internal voltage signal.

According to an embodiment, an internal voltage generation circuit includes a flag signal generator suitable for generating a first flag signal which is enabled after a first predetermined time from a moment that a deep power-down mode terminates and suitable for generating a second flag signal which is enabled after a second predetermined time from a moment that the first flag signal is enabled; a drive signal generator suitable for receiving the first and second flag signals to generate a first drive signal and a second drive signal and suitable for receiving a pre-oscillation signal in response to the first and second flag signals to generate a third drive signal and a fourth drive signal; and an internal voltage generator suitable for sequentially activating a plurality of drivers in response to the first and second drive signals and suitable for sequentially activating a plurality of pumps in response to the third and fourth drive signals.

According to an embodiment, an internal voltage generation circuit includes a flag signal generator suitable for sequentially generating and enable flag signals after a deep power-down mode terminates; a drive signal generator suitable for receiving the flag signals and to generate drive signals based on a number of received said flag signals, and suitable for receiving a pre-oscillation signal in response to the number of received said flag signals to generate additional drive signals; and an internal voltage generator suitable for activating a number of drivers in response to the number of received said flag signals, and suitable for activating a number of pumps in response to the number of received additional drive signals.

BRIEF DESCRIPTION OF THE DRAWINGS

Embodiments of the present invention will become more apparent in view of the attached drawings and accompanying detailed descriptions, in which.

DETAILED DESCRIPTION

Various embodiments of the present invention will be described hereinafter with reference to the accompanying drawings. However, the embodiments described herein are for illustrative purposes only and are not intended to limit the scope of the present invention.

Figure 1:
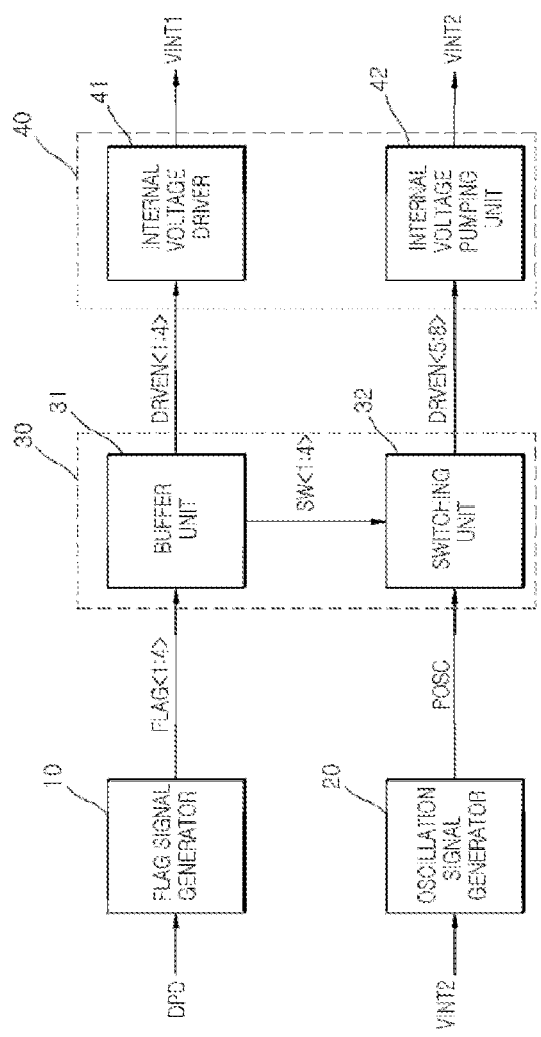
FIG. 1 is a block diagram illustrating an internal voltage generation circuit according to an embodiment of the present invention.

Referring to FIG. 1, an internal voltage generation circuit according to the present embodiment may include a flag signal generator 10, an oscillation signal generator 20, a drive signal generator 30 and an internal voltage generator 40. The flag signal generator 10 may be operably coupled with the drive signal generator 30 and the drive signal generator 30 may be operably coupled with the internal voltage generator 40. The oscillation signal generator 20 may be operably coupled with the drive signal generator 30 and the drive signal generator 30 may be operably coupled with the internal voltage generator 40.

The flag signal generator 10 may receive a deep power-down signal DPD to generate first to fourth flag signals FLAG<1:4> which are initialized in a deep power-down mode and are sequentially enabled after a predetermined time from a moment that the deep power-down mode terminates.

The oscillation signal generator 20 may generate a pre-oscillation signal POSC including pulses which are periodically created when a level of a second internal voltage signal VINT2 is lower than a predetermined level.

The drive signal generator 30 may include a buffer unit 31 that buffers the first to fourth flag signals FLAG<1:4> to generate first to fourth drive signals DRVEN<1:4> and first to fourth switching signals SW<1:4> and a switching unit 32 that buffers the pre-oscillation signal POSC in response to the first to fourth switching signals SW<1:4> to generate fifth to eighth drive signals DRVEN<5:8> (or additional drive signals).

The internal voltage generator 40 may include an internal voltage driver 41 that outputs a first internal voltage signal VINT1 generated by first to fourth drivers (not shown) which are sequentially driven according to the first to fourth drive signals DRVEN<1:4> and an internal voltage pumping unit 42 that outputs a second internal voltage signal VINT2 pumped by first to fourth pumps (not shown) which are sequentially driven according to the fifth to eighth drive signals DRVEN<5:8>. In some embodiments, the internal voltage driver 41 may be realized using a plurality of drivers that drive the first internal voltage signal VINT1 or drive respective ones of a plurality of internal voltage signals. In addition, the internal voltage pumping unit 42 may be realized using a plurality of pumps that pump the second internal voltage signal VINT2 or pump respective ones of a plurality of internal voltage signals.

A configuration of the flag signal generator 10 will be described more fully hereinafter with reference to FIG. 2.

Figure 2:
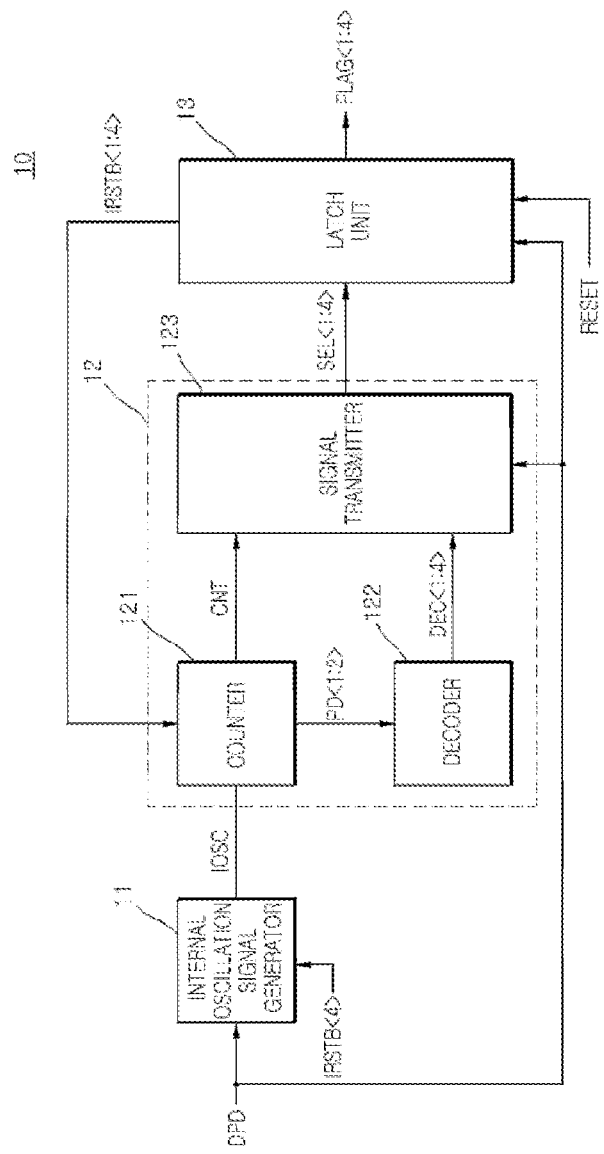
FIG. 2 is a block diagram illustrating a flag signal generator included in the internal voltage generation circuit of FIG. 1.

Referring to FIG. 2, the flag signal generator 10 may include an internal oscillation signal generator 11, a selection signal generator 12 and a latch unit 13. The internal oscillation signal generator 11 may be electrically coupled with the selection signal generator 12 and the latch unit 13. The selection signal generator 12 may be electrically coupled with the internal oscillation signal generator 11 and the latch unit 13. The latch unit 13 may be electrically coupled with the selection signal generator 12 and the internal oscillation signal generator 11.

When the deep power-down mode terminates, the internal oscillation signal generator 11 may receive the deep power-down signal DPD having a logic "low" level to generate an internal oscillation signal IOSC including pulses which are periodically created. Further, the internal oscillation signal generator 11 may receive a fourth internal reset signal IRSTB<4> enabled to have a logic "high" level to generate the internal oscillation signal IOSC disabled to have a logic "low" level. An operation for generating the fourth internal reset signal IRSTB<4> will be described hereinafter.

The selection signal generator 12 may include a counter 121, a decoder 122 and a signal transmitter 123. The counter 121 may execute a counting operation in response to the pulses of the internal oscillation signal IOSC to generate a counted signal CNT and may execute the counting operation in response to first to fourth internal reset signals IRSTB<1:4> to generate first and second pre-decode signals PD<1:2>. The decoder 122 may decode the first and second pre-decode signals PD<1:2> to generate first to fourth decode signals DEC<1:4>, one of which is selectively enabled. The signal transmitter 123 may output the counted signal CNT as one of first to fourth selection signals SEL<1:4> according to a level combination of the first to fourth decode signals DEC<1:4>.

The latch unit 13 may generate the first to fourth flag signals FLAG<1:4> which are initialized to have a logic "low" level in the deep power-down mode and may latch the first to fourth selection signals SEL<1:4> to generate the first to fourth flag signals FLAG<1:4> when the deep power-down mode terminates. Further, the latch unit 13 may generate the first internal reset signal IRSTB<1> including a pulse created when the first flag signal FLAG<1> is enabled and may generate the second internal reset signal IRSTB<2> including a pulse created when the second flag signal FLAG<2> is enabled. In addition, the latch unit 13 may generate the third internal reset signal IRSTB<3> including a pulse created when the third flag signal FLAG<3> is enabled and may generate the fourth internal reset signal IRSTB<4> including a pulse created when the fourth flag signal FLAG<4> is enabled. Additionally, the latch unit 13 may receive a reset signal RESET as shown in FIG. 2.

A configuration of the internal oscillation signal generator 11 will be described more fully hereinafter with reference to FIG. 3.

Figure 3:
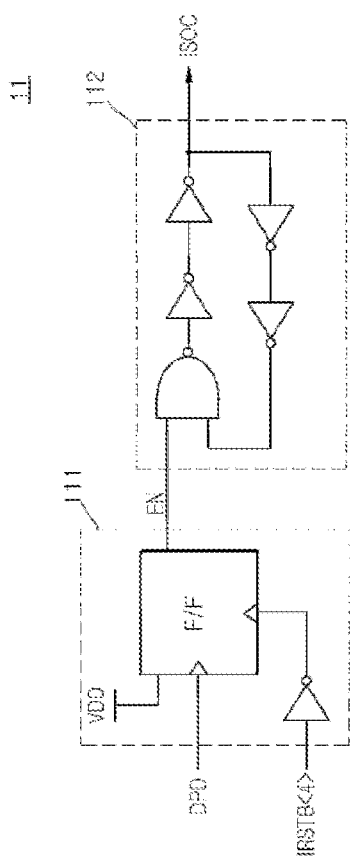
FIG. 3 is a circuit diagram illustrating an internal oscillation signal generator included in the flag signal generator of FIG. 2.

Referring to FIG. 3, the internal oscillation signal generator 11 may include an enablement signal generator 111 and an oscillator 112. The enablement signal generator 111 may be electrically coupled with the oscillator 112.

The enablement signal generator 111 may receive the deep power-down signal DPD having a logic "low" level to output a power supply voltage signal VDD as an enablement signal EN when the deep power-down mode terminates. Moreover, the enablement signal generator 111 may generate the enablement signal EN having a logic "low" level when a pulse of the fourth internal reset signal IRSTB<4> has a logic "low" level. In some embodiments, the enablement signal generator 111 may be realized using a flip-flop F/F.

The oscillator 112 may generate the internal oscillation signal IOSC including pulses which are periodically created when the enablement signal EN having a logic "low" level is inputted to thereto. The oscillator 112 may be realized using a ring oscillator, and a cycle time of the pulses of the internal oscillation signal IOSC may be controlled by an internal resistance value of the oscillator 112.

A configuration of the counter 121 will be described more fully hereinafter with reference to FIG. 4.

Figure 4:
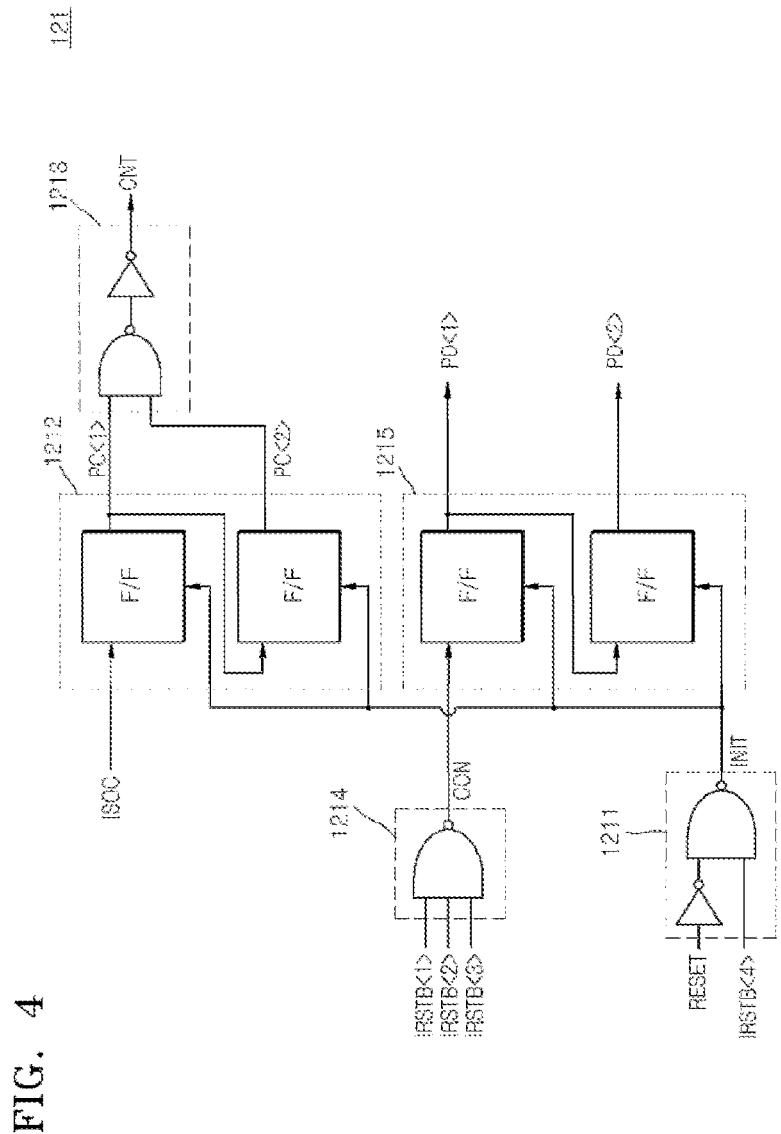
FIG. 4 is a circuit diagram illustrating a counter included in the flag signal generator of FIG. 2.

Referring to FIG. 4, the counter 121 may include an initialization signal generator 1211, a first counter 1212, a logic unit 1213, a control signal generator 1214 and a second counter 1215. The initialization signal generator 1211 may be electrically coupled with the first counter 1212 and the second counter 1215. The control signal generator 1214 may be electrically coupled with the second counter 1215. The logic unit 1213 may be electrically coupled with the first counter 1212. Thus, the second counter 1215 may be electrically coupled with the initialization signal generator 1211, the control signal generator 1214, and the first counter 1212, and the first counter 1212 may be electrically coupled with the logic unit 1213, second counter 1215, and the initialization signal generator 1211.

The initialization signal generator 1211 may generate an initialization signal INIT having a logic "high" level when a reset signal RESET having a logic "high" level or the fourth internal reset signal IRSTB<4> having a logic "low" level is inputted thereto in an initialization mode after an operation of a semiconductor device including the internal voltage generation circuit starts.

The first counter 1212 may execute a counting operation in response to the pulses of the internal oscillation signal IOSC to generate first and second pre-counted signals PC<1:2>, and the first and second pre-counted signals PC<1:2> may be initialized to have a logic "low" level when the initialization signal INIT having a logic "high" level is inputted to the first counter 1212. The first counter 1212 may be realized using flip-flops.

The logic unit 1213 may generate the counted signal CNT when the first and second pre-counted signals PC<1:2> have a predetermined level combination. In the present embodiment, the predetermined level combination of the first and second pre-counted signals PC<1:2> means that both the first and second pre-counted signals PC<1:2> have a logic "high" level.

The control signal generator 1214 may generate a control signal CON including pulses which are created to have a logic "high" level whenever at least one of the first to third internal reset signals IRSTB<1:3> has a logic "low" level. An operation for generating the first to third internal reset signals IRSTB<1:3> will be described later.

The second counter 1215 may execute a counting operation in response to the pulses of the control signal CON to output first and second pre-decode signals PD<1:2>, and the first and second pre-decode signals PD<1:2> may be initialized to have a logic "low" level when the initialization signal INIT having a logic "high" level is inputted to the second counter 1215. The second counter 1215 may be realized using flip-flops.

A configuration of the signal transmitter 123 (as illustrated in FIG. 2) will be described more fully hereinafter with reference to FIG. 5.

Figure 5:
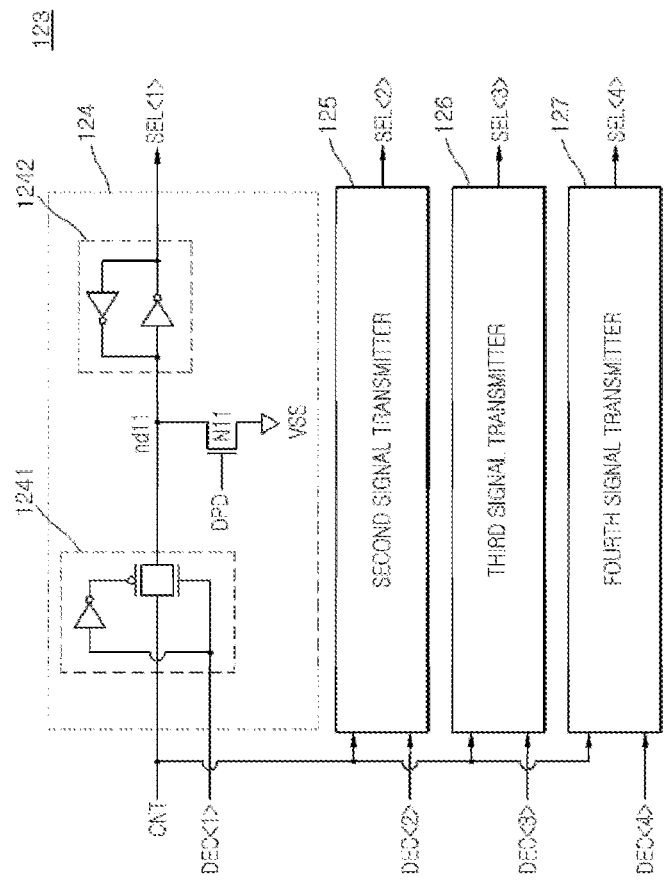
FIG. 5 is a schematic view illustrating a signal transmitter included in the flag signal generator of FIG. 2.

Referring to FIG. 5, the signal transmitter 123 may include first to fourth signal transmitters 124, 125, 126 and 127. The first to fourth signal transmitters 124, 125, 126 and 127 all being electrically coupled with one another.

The first signal transmitter 124 may include a transfer unit 1241 that is turned to output the counted signal CNT through a node nd11 when the first decode signal DEC<1> has a logic "high" level, a driving element N11 that receives the deep power-down signal DPD to drive the node nd11 to have a logic "low" level, and a latch unit 1242 that latches a signal on the node nd11 to generate the first selection signal SEL<1>. That is, the first signal transmitter 124 may generate the first selection signal SEL<1> having a logic "high" level in the deep power-down mode and may inversely buffer the counted signal CNT to generate the first selection signal SEL<1> after the deep power-down mode terminates. As shown in FIG. 5 the drain of the driving element N11 may be electrically coupled with ground voltage VSS.

The second signal transmitter 125 may generate the second selection signal SEL<2> having a logic "high" level in the deep power-down mode and may inversely buffer the counted signal CNT to generate the second selection signal SEL<2> when the second decode signal DEC<2> having a logic "high" level is inputted thereto.

The third signal transmitter 126 may generate the third selection signal SEL<3> having a logic "high" level in the deep power-down mode and may inversely buffer the counted signal CNT to generate the third selection signal SEL<3> when the third decode signal DEC<3> having a logic "high" level is inputted thereto.

The fourth signal transmitter 127 may generate the fourth selection signal SEL<4> having a logic "high" level in the deep power-down mode and may inversely buffer the counted signal CNT to generate the fourth selection signal SEL<4> when the fourth decode signal DEC<4> having a logic "high" level is inputted thereto. Each of the second, third and fourth signal transmitters 125, 126 and 127 may have substantially the same configuration as the first signal transmitter 124 except input/output (I/O) signals thereof. Thus, detailed descriptions of the second, third and fourth signal transmitters 125, 126 and 127 will be omitted hereinafter.

Figure 6:
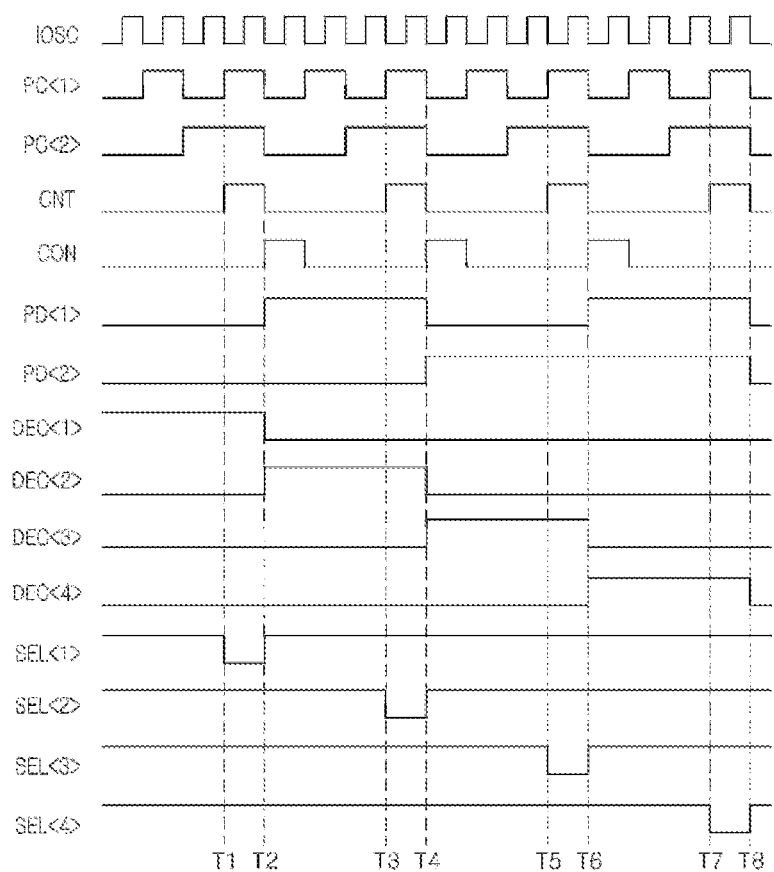
FIG. 6 is a timing diagram illustrating an operation of the internal voltage generation circuit according to an embodiment of the present invention.

An operation of the selection signal generator 12 having the aforementioned configuration will be described hereinafter with reference to FIG. 6 in conjunction with an example in which the counting operation is executed in response to the pulses of the internal oscillation signal IOSC to generate the first to fourth selection signals SEL<1:4> after the deep power-down mode terminates.

First, at a point of time "T1", the first counter 1212 of the counter 121 may execute a counting operation in response to the pulse of the internal oscillation signal IOSC to generate the first pre-counted signal PC<1> having a logic "high" level and the second pre-counted signal PC<2> having a logic "high" level. The logic unit 1213 of the counter 121 may generate the counted signal CNT having a logic "high" level in response to the first and second pre-counted signals PC<1:2> having a logic "high" level. The second counter 1215 of the counter 121 may not execute any counting operations in response to the control signal CON having a logic "low" level to generate the first and second pre-decode signals PD<1:2> having a logic "low" level. The decoder 122 may decode the first and second pre-decode signals PD<1:2> having a logic "low" level to generate the first decode signal DEC<1> having a logic "high" level. The first signal transmitter 124 of the signal transmitter 123 may inversely buffer the counted signal CNT in response to the first decode signal DEC<1> having a logic "high" level to generate the first selection signal SEL<1> having a logic "low" level.

Subsequently, at a point of time "T2", the first counter 1212 of the counter 121 may execute a counting operation in response to the pulse of the internal oscillation signal IOSC to generate the first and second pre-counted signals PC<1:2> having a logic "low" level. The logic unit 1213 of the counter 121 may generate the counted signal CNT having a logic "low" level in response to the first and second pre-counted signals PC<1:2> having a logic "low" level. In such a case, the control signal generator 1214 of the counter 121 may receive the first internal reset signal IRSTB<1> having a logic "low" level to generate the control signal CON having a logic "high" level. An operation for generating the first internal reset signal IRSTB<1> will be described later. The second counter 1215 of the counter 121 may execute a counting operation in response to the control signal CON having a logic "high" level to generate the first pre-decode signal PD<1> having a logic "high" level and the second pre-decode signal PD<2> having a logic "low" level. The decoder 122 may decode the first pre-decode signal PD<1> having a logic "high" level and the second pre-decode signal PD<2> having a logic "low" level to generate the second decode signal DEC<2> having a logic "high" level.

Next, at a point of time "T3", the first counter 1212 of the counter 121 may execute a counting operation in response to the pulse of the internal oscillation signal IOSC to generate the first pre-counted signal PC<1> having a logic "high" level and the second pre-counted signal PC<2> having a logic "high" level. The logic unit 1213 of the counter 121 may generate the counted signal CNT having a logic "high" level in response to the first and second pre-counted signals PC<1:2> having a logic "high" level. The second counter 1215 of the counter 121 may not execute any counting operations in response to the control signal CON having a logic "low" level to generate the first pre-decode signal PD<1> having a logic "high" level and the second pre-decode signal PD<2> having a logic "low" level. The decoder 122 may decode the first pre-decode signal PD<1> having a logic "high" level and the second pre-decode signal PD<2> having a logic "low" level to generate the second decode signal DEC<2> having a logic "high" level. The second signal transmitter 125 of the signal transmitter 123 may inversely buffer the counted signal CNT in response to the second decode signal DEC<2> having a logic "high" level to generate the second selection signal SEL<2> having a logic "low" level.

Subsequently, at a point of time "T4", the first counter 1212 of the counter 121 may execute a counting operation in response to the pulse of the internal oscillation signal IOSC to generate the first and second pre-counted signals PC<1:2> having a logic "low" level. The logic unit 1213 of the counter 121 may generate the counted signal CNT having a logic "low" level in response to the first and second pre-counted signals PC<1:2> having a logic "low" level. In such a case, the control signal generator 1214 of the counter 121 may receive the second internal reset signal IRSTB<2> having a logic "low" level to generate the control signal CON having a logic "high" level. An operation for generating the second internal reset signal IRSTB<2> will be described later. The second counter 1215 of the counter 121 may execute a counting operation in response to the control signal CON having a logic "high" level to generate the first pre-decode signal PD<1> having a logic "low" level and the second pre-decode signal PD<2> having a logic "high" level. The decoder 122 may decode the first pre-decode signal PD<1> having a logic "low" level and the second pre-decode signal PD<2> having a logic "high" level to generate the third decode signal DEC<3> having a logic "high" level.

Next, at a point of time "T5", the first counter 1212 of the counter 121 may execute a counting operation in response to the pulse of the internal oscillation signal IOSC to generate the first and second pre-counted signals PC<1:2> having a logic "high" level. The logic unit 1213 of the counter 121 may generate the counted signal CNT having a logic "high" level in response to the first and second pre-counted signals PC<1:2> having a logic "high" level. The second counter 1215 of the counter 121 may not execute any counting operations in response to the control signal CON having a logic "low" level to generate the first pre-decode signal PD<1> having a logic "low" level and the second pre-decode signal PD<2> having a logic "high" level. The decoder 122 may decode the first pre-decode signal PD<1> having a logic "low" level and the second pre-decode signal PD<2> having a logic "high" level to generate the third decode signal DEC<3> having a logic "high" level. The third signal transmitter 126 of the signal transmitter 123 may inversely buffer the counted signal CNT in response to the third decode signal DEC<3> having a logic "high" level to generate the third selection signal SEL<3> having a logic "low" level.

Subsequently, at a point of time "T6", the first counter 1212 of the counter 121 may execute a counting operation in response to the pulse of the internal oscillation signal IOSC to generate the first and second pre-counted signals PC<1:2> having a logic "low" level. The logic unit 1213 of the counter 121 may generate the counted signal CNT having a logic "low" level in response to the first and second pre-counted signals PC<1:2> having a logic "low" level. In such a case, the control signal generator 1214 of the counter 121 may receive the third internal reset signal IRSTB<3> having a logic "low" level to generate the control signal CON having a logic "high" level. An operation for generating the third internal reset signal IRSTB<3> will be described later. The second counter 1215 of the counter 121 may execute a counting operation in response to the control signal CON having a logic "high" level to generate the first and second pre-decode signals PD<1:2> having a logic "high" level. The decoder 122 may decode the first and second pre-decode signals PD<1:2> having a logic "high" level to generate the fourth decode signal DEC<4> having a logic "high" level.

Next, at a point of time "T7", the first counter 1212 of the counter 121 may execute a counting operation in response to the pulse of the internal oscillation signal IOSC to generate the first and second pre-counted signals PC<1:2> having a logic "high" level. The logic unit 1213 of the counter 121 may generate the counted signal CNT having a logic "high" level in response to the first and second pre-counted signals PC<1:2> having a logic "high" level. The second counter 1215 of the counter 121 may not execute any counting operations in response to the control signal CON having a logic "low" level to generate the first pre-decode signal PD<1> having a logic "high" level and the second pre-decode signal PD<2> having a logic "high" level. The decoder 122 may decode the first pre-decode signal PD<1> having a logic "high" level and the second pre-decode signal PD<2> having a logic "high" level to generate the fourth decode signal DEC<4> having a logic "high" level. The fourth signal transmitter 127 of the signal transmitter 123 may inversely buffer the counted signal CNT in response to the fourth decode signal DEC<4> having a logic "high" level to generate the fourth selection signal SEL<4> having a logic "low" level.

Subsequently, at a point of time "T8", the first counter 1212 of the counter 121 may execute a counting operation in response to the pulse of the internal oscillation signal IOSC to generate the first and second pre-counted signals PC<1:2> having a logic "low" level. The logic unit 1213 of the counter 121 may generate the counted signal CNT having a logic "low" level in response to the first and second pre-counted signals PC<1:2> having a logic "low" level. In such a case, the control signal generator 1214 of the counter 121 may generate the control signal CON having a logic "low" level because all the first, second and third internal reset signals IRSTB<1:3> have a logic "high" level. The initialization signal generator 1211 of the counter 121 may receive the fourth internal reset signal IRSTB<4> have a logic "low" level to generate the initialization signal INIT having a logic "high" level. An operation for generating the first to fourth internal reset signals IRSTB<1:4> will be described later. The first counter 1212 of the counter 121 may receive the initialization signal INIT having a logic "high" level to initialize the first and second pre-counted signals PC<1:2> to have a logic "low" level.

The selection signal generator 12 set forth above may generate the first to fourth selection signals SEL<1:4> which are sequentially enabled after the deep power-down mode terminates.

A configuration of the latch unit 13 will be described more fully hereinafter with respect to FIG. 7.

Figure 7:
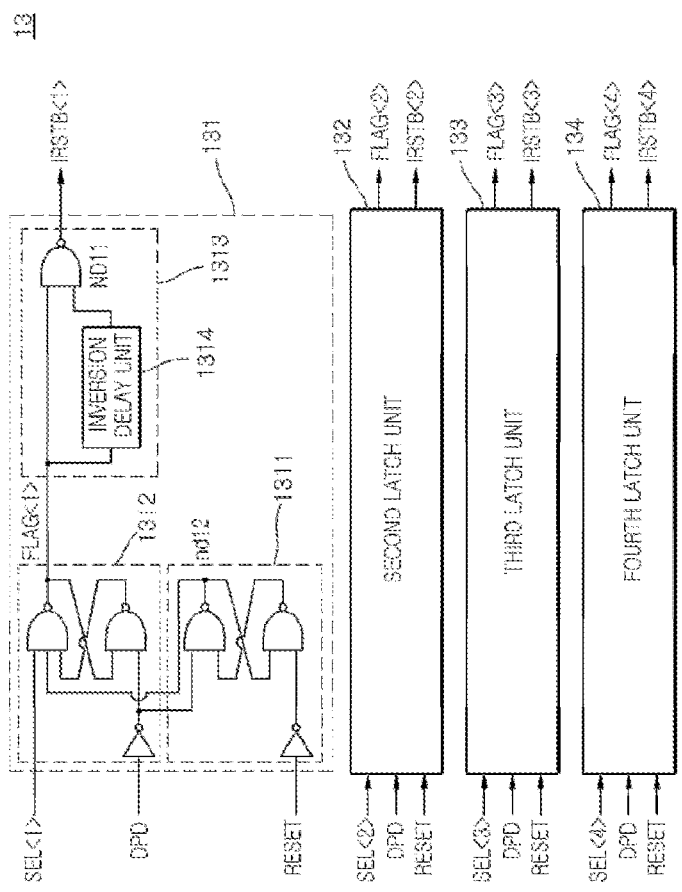
FIG. 7 is a schematic view illustrating a latch unit included in the flag signal generator of FIG. 2.

Referring to FIG. 7, the latch unit 13 may include first to fourth latch units 131, 132, 133 and 134.

The first latch unit 131 may include a first SR latch unit 1311, a second SR latch unit 1312 and a first internal reset signal generator 1313. The first SR latch unit 1311 may be electrically coupled with the second SR latch unit 1312, and the second SR latch unit 1312 may be electrically coupled with the first internal reset signal generator 1313. The first SR latch unit 1311 may receive the reset signal RESET having a logic "high" level and the deep power-down signal DPD having a logic "low" level to drive a node nd12 to have a logic "low" level in the initialization mode. The second SR latch unit 1312 may initialize the first flag signal FLAG<1> to have a logic "high" level in the initialization mode and may latch the first selection signal SEL<1> to generate the first flag signal FLAG<1> after the deep power-down mode terminates. The first internal reset signal generator 1313 may generate the first internal reset signal IRSTB<1> including a pulse which is created to have a pulse width corresponding to a time period from a moment that the first flag signal FLAG<1> is generated to have a logic "high" level to a moment that a delay time of an inversion delay unit 1314 elapses. That is, the first latch unit 131 may generate the first flag signal FLAG<1> having a logic "high" level in the initialization mode, may generate the first flag signal FLAG<1> having a logic "low" level in the initialization mode, and may generate the first flag signal FLAG<1> which is enabled to have a logic "high" level at a moment that the first selection signal SEL<1> having a logic "low" level is inputted after the deep power-down mode terminates. Further, the first latch unit 131 may generate the first internal reset signal IRSTB<1> including a pulse which is created to have a logic "low" level at a moment that the first flag signal FLAG<1> is generated to have a logic "high" level.

The second latch unit 132 may generate the second flag signal FLAG<2> having a logic "high" level in the initialization mode, may generate the second flag signal FLAG<2> having a logic "low" level in the deep power-down mode, and may generate the second flag signal FLAG<2> which is enabled to have a logic "high" level at a moment that the second selection signal SEL<2> having a logic "low" level is inputted thereto after termination of the deep power-down mode. Further, the second latch unit 132 may generate the second internal reset signal IRSTB<2> including a pulse which is created to have a logic "low" level at a moment that the second flag signal FLAG<2> is generated to have a logic "high" level.

The third latch unit 133 may generate the third flag signal FLAG<3> having a logic "high" level in the initialization mode, may generate the third flag signal FLAG<3> having a logic "low" level in the deep power-down mode, and may generate the third flag signal FLAG<3> which is enabled to have a logic "high" level at a moment that the third selection signal SEL<3> having a logic "low" level is inputted thereto after termination of the deep power-down mode. Further, the third latch unit 133 may generate the third internal reset signal IRSTB<3> including a pulse which is created to have a logic "low" level at a moment that the third flag signal FLAG<3> is generated to have a logic "high" level.

The fourth latch unit 134 may generate the fourth flag signal FLAG<4> having a logic "high" level in the initialization mode, may generate the fourth flag signal FLAG<4> having a logic "low" level in the deep power-down mode, and may generate the fourth flag signal FLAG<4> which is enabled to have a logic "high" level at a moment that the fourth selection signal SEL<4> having a logic "low" level is inputted thereto after termination of the deep power-down mode. Further, the fourth latch unit 134 may generate the fourth internal reset signal IRSTB<4> including a pulse which is created to have a logic "low" level at a moment that the fourth flag signal FLAG<4> is generated to have a logic "high" level.

Each of the second, third and fourth latch units 132, 133 and 134 may have substantially the same configuration as the first latch unit 131 except input/output (I/O) signals thereof. Thus, detailed descriptions of the second, third and fourth latch units 132, 133 and 134 will be omitted hereinafter.

Figure 8:
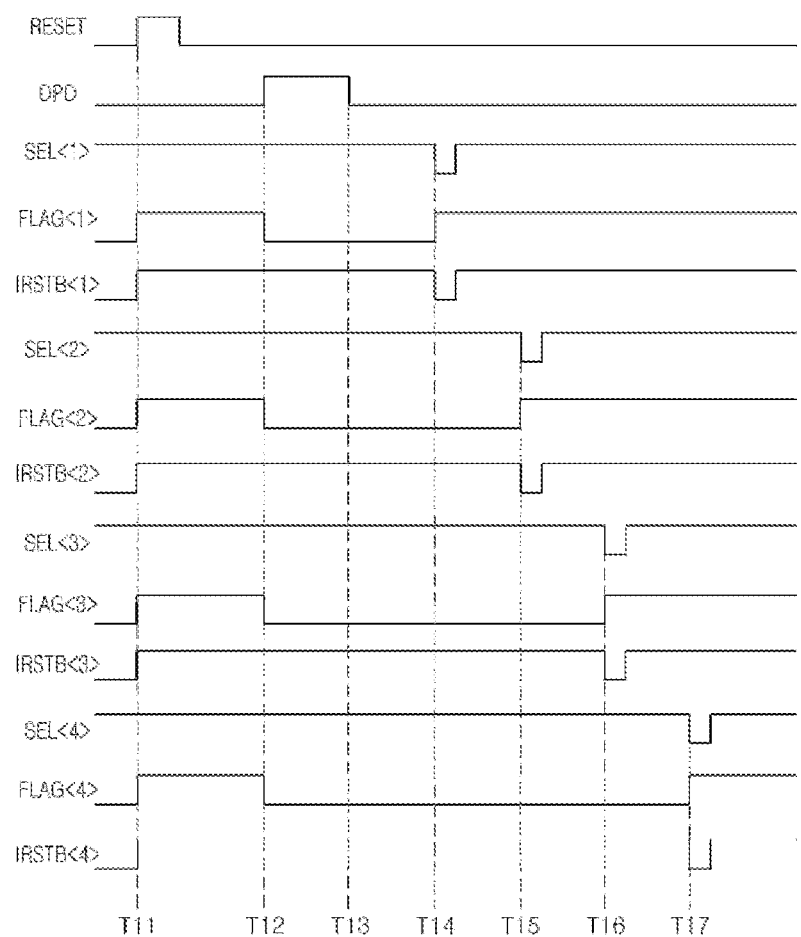
FIG. 8 is a timing diagram illustrating an operation of the latch unit shown in FIG. 7.

An operation of the latch unit 13 having the aforementioned configuration will be described hereinafter with reference to FIG. 8. The operation of the latch unit 13 will be described in conjunction with operations for generating internal voltage signals in response to the first to fourth flag signals FLAG<1:4> and the first to fourth internal reset signals IRSTB<1:4> which are generated in the initialization mode, in the deep power-down mode and after the deep power-down mode.

First, the initialization mode may start at a point of time "T11", and an operation for the initialization mode will be described hereinafter.

The first latch unit 131 may receive the reset signal RESET having a logic "high" level and the deep power-down signal DPD having a logic "low" level to generate the first flag signal FLAG<1> having a logic "high" level and the first internal reset signal IRSTB<1> having a logic "high" level.

The second latch unit 132 may receive the reset signal RESET having a logic "high" level and the deep power-down signal DPD having a logic "low" level to generate the second flag signal FLAG<2> having a logic "high" level and the second internal reset signal IRSTB<2> having a logic "high" level.

The third latch unit 133 may receive the reset signal RESET having a logic "high" level and the deep power-down signal DPD having a logic "low" level to generate the third flag signal FLAG<3> having a logic "high" level and the third internal reset signal IRSTB<3> having a logic "high" level.

The fourth latch unit 134 may receive the reset signal RESET having a logic "high" level and the deep power-down signal DPD having a logic "low" level to generate the fourth flag signal FLAG<4> having a logic "high" level and the fourth internal reset signal IRSTB<4> having a logic "high" level.

The drive signal generator 30 may receive the first to fourth flag signals FLAG<1:4> having a logic "high" level to generate the first to fourth drive signals DRVEN<1:4> and the fifth to eighth drive signals DRVEN<5:8>.

The internal voltage driver 41 may activate first to fourth drivers (not shown) in response to the first to fourth drive signals DRVEN<1:4> having a logic "high" level to drive the first internal voltage signal VINT1.

The internal voltage pumping unit 42 may activate first to fourth pumps (not shown) in response to the fifth to eighth drive signals DRVEN<5:8>, each of which includes pulses periodically created, to output the second internal voltage signal VINT2 pumped by the first to fourth pumps.

Next, the deep power-down mode may start at a point of time "T12", and an operation for the deep power-down mode will be described hereinafter.

The first latch unit 131 may receive the reset signal RESET having a logic "low" level and the deep power-down signal DPD having a logic "high" level to generate the first flag signal FLAG<1> having a logic "low" level and the first internal reset signal IRSTB<1> having a logic "high" level.

The second latch unit 132 may receive the reset signal RESET having a logic "low" level and the deep power-down signal DPD having a logic "high" level to generate the second flag signal FLAG<2> having a logic "low" level and the second internal reset signal IRSTB<2> having a logic "high" level.

The third latch unit 133 may receive the reset signal RESET having a logic "low" level and the deep power-down signal DPD having a logic "high" level to generate the third flag signal FLAG<3> having a logic "low" level and the third internal reset signal IRSTB<3> having a logic "high" level.

The fourth latch unit 134 may receive the reset signal RESET having a logic "low" level and the deep power-down signal DPD having a logic "high" level to generate the fourth flag signal FLAG<4> having a logic "low" level and the fourth internal reset signal IRSTB<4> having a logic "high" level.

The drive signal generator 30 may receive the first to fourth flag signals FLAG<1:4> having a logic "low" level to generate the first to fourth drive signals DRVEN<1:4> having a logic "low" level and the fifth to eighth drive signals DRVEN<5:8> having a logic "low" level.

The internal voltage driver 41 may turn off the first to fourth drivers in response to the first to fourth drive signals DRVEN<1:4> having a logic "low" level not to drive the first internal voltage signal VINT1.

The internal voltage pumping unit 42 may turn off the first to fourth pumps in response to the fifth to eighth drive signals DRVEN<5:8> having a logic "low" level not to pump the second internal voltage signal VINT2.

Subsequently, the deep power-down mode may terminate at a point of time "T13", and an operation for the termination of the deep power-down mode will be described hereinafter.

The first latch unit 131 may receive the reset signal RESET having a logic "low" level and the deep power-down signal DPD having a logic "low" level to latch the first flag signal FLAG<1> generated at the point of time "T12" because the first selection signal SEL<1> has a logic "high" level. As a result, the first latch unit 131 may generate the first flag signal FLAG<1> having a logic "low" level and the first internal reset signal IRSTB<1> having a logic "high" level.

The second latch unit 132 may receive the reset signal RESET having a logic "low" level and the deep power-down signal DPD having a logic "low" level to latch the second flag signal FLAG<2> generated at the point of time "T12" because the second selection signal SEL<2> has a logic "high" level. As a result, the second latch unit 132 may generate the second flag signal FLAG<2> having a logic "low" level and the second internal reset signal IRSTB<2> having a logic "high" level.

The third latch unit 133 may receive the reset signal RESET having a logic "low" level and the deep power-down signal DPD having a logic "low" level to latch the third flag signal FLAG<3> generated at the point of time "T12" because the third selection signal SEL<3> has a logic "high" level. As a result, the third latch unit 133 may generate the third flag signal FLAG<3> having a logic "low" level and the third internal reset signal IRSTB<3> having a logic "high" level.

The fourth latch unit 134 may receive the reset signal RESET having a logic "low" level and the deep power-down signal DPD having a logic "low" level to latch the fourth flag signal FLAG<4> generated at the point of time "T12" because the fourth selection signal SEL<4> has a logic "high" level. As a result, the fourth latch unit 134 may generate the fourth flag signal FLAG<4> having a logic "low" level and the fourth internal reset signal IRSTB<4> having a logic "high" level.

The drive signal generator 30 may receive the first to fourth flag signals FLAG<1:4> having a logic "low" level to generate the first to fourth drive signals DRVEN<1:4> having a logic "low" level and the fifth to eighth drive signals DRVEN<5:8> having a logic "low" level.

The internal voltage driver 41 may turn off the first to fourth drivers in response to the first to fourth drive signals DRVEN<1:4> having a logic "low" level not to drive the first internal voltage signal VINT1.

The internal voltage pumping unit 42 may turn off the first to fourth pumps in response to the fifth to eighth drive signals DRVEN<5:8> having a logic "low" level not to pump the second internal voltage signal VINT2.

Next, a logic "low" level pulse of the first selection signal SEL<1> may be inputted at a point of time "T14" after the termination of the deep power-down mode, and an operation of the internal voltage generation circuit with the pulse of the first selection signal SEL<1> will be described hereinafter.

The first latch unit 131 may receive the reset signal RESET having a logic "low" level and the deep power-down signal DPD having a logic "low" level to generate the first flag signal FLAG<1> having a logic "high" level and the first internal reset signal IRSTB<1> having a logic "low" level because the first selection signal SEL<1> has a logic "low" level.

The second latch unit 132 may receive the reset signal RESET having a logic "low" level and the deep power-down signal DPD having a logic "low" level to latch the second flag signal FLAG<2> generated at the point of time "T13" because the second selection signal SEL<2> has a logic "high" level. As a result, the second latch unit 132 may generate the second flag signal FLAG<2> having a logic "low" level and the second internal reset signal IRSTB<2> having a logic "high" level.

The third latch unit 133 may receive the reset signal RESET having a logic "low" level and the deep power-down signal DPD having a logic "low" level to latch the third flag signal FLAG<3> generated at the point of time "T13" because the third selection signal SEL<3> has a logic "high" level. As a result, the third latch unit 133 may generate the third flag signal FLAG<3> having a logic "low" level and the third internal reset signal IRSTB<3> having a logic "high" level.

The fourth latch unit 134 may receive the reset signal RESET having a logic "low" level and the deep power-down signal DPD having a logic "low" level to latch the fourth flag signal FLAG<4> generated at the point of time "T13" because the fourth selection signal SEL<4> has a logic "high" level. As a result, the fourth latch unit 134 may generate the fourth flag signal FLAG<4> having a logic "low" level and the fourth internal reset signal IRSTB<4> having a logic "high" level.

The drive signal generator 30 may buffer the first flag signal FLAG<1> having a logic "high" level to generate the first drive signal DRVEN<1> having a logic "high" level and the fifth drive signal DRVEN<5> including pulses which are periodically created. In such a case, the second to fourth drive signals DRVEN<2:4> may be generated to have a logic "low" level and the sixth to eighth drive signals DRVEN<6:8> may be generated to have a logic "low" level.

The internal voltage driver 41 may turn on the first driver in response to the first drive signal DRVEN<1> having a logic "high" level to generate the first internal voltage signal VINT1.

The internal voltage pumping unit 42 may turn on the first pump in response to the fifth drive signal DRVEN<5> including pulses, which are periodically created, to pump the second internal voltage signal VINT2.

Next, a logic "low" level pulse of the second selection signal SEL<2> may be inputted at a point of time "T15" after the termination of the deep power-down mode, and an operation of the internal voltage generation circuit with the pulse of the second selection signal SEL<2> will be described hereinafter.

The first latch unit 131 may receive the reset signal RESET having a logic "low" level and the deep power-down signal DPD having a logic "low" level to latch the first flag signal FLAG<1> generated at the point of time "T14" because the first selection signal SEL<1> has a logic "high" level. As a result, the first latch unit 131 may generate the first flag signal FLAG<1> having a logic "high" level and the first internal reset signal IRSTB<1> having a logic "high" level.

The second latch unit 132 may receive the reset signal RESET having a logic "low" level and the deep power-down signal DPD having a logic "low" level to generate the second flag signal FLAG<2> having a logic "high" level and the second internal reset signal IRSTB<2> having a logic "low" level because the second selection signal SEL<2> has a logic "low" level.

The third latch unit 133 may receive the reset signal RESET having a logic "low" level and the deep power-down signal DPD having a logic "low" level to latch the third flag signal FLAG<3> generated at the point of time "T14" because the third selection signal SEL<3> has a logic "high" level. As a result, the third latch unit 133 may generate the third flag signal FLAG<3> having a logic "low" level and the third internal reset signal IRSTB<3> having a logic "high" level.

The fourth latch unit 134 may receive the reset signal RESET having a logic "low" level and the deep power-down signal DPD having a logic "low" level to latch the fourth flag signal FLAG<4> generated at the point of time "T14" because the fourth selection signal SEL<4> has a logic "high" level. As a result, the fourth latch unit 134 may generate the fourth flag signal FLAG<4> having a logic "low" level and the fourth internal reset signal IRSTB<4> having a logic "high" level.

The drive signal generator 30 may buffer the first and second flag signals FLAG<1:2> having a logic "high" level to generate the first and second drive signals DRVEN<1:2> having a logic "high" level and the fifth and sixth drive signals DRVEN<5:6> including pulses which are periodically created. In such a case, the third and fourth drive signals DRVEN<3:4> may be generated to have a logic "low" level and the seventh and eighth drive signals DRVEN<7:8> may be generated to have a logic "low" level.

The internal voltage driver 41 may turn on the first and second drivers in response to the first and second drive signals DRVEN<1:2> having a logic "high" level to generate the first internal voltage signal VINT1.

The internal voltage pumping unit 42 may turn on the first and second pumps in response to the fifth and sixth drive signals DRVEN<5:6> including pulses, which are periodically created, to pump the second internal voltage signal VINT2.

Next, a logic "low" level pulse of the third selection signal SEL<3> may be inputted at a point of time "T16" after the termination of the deep power-down mode, and an operation of the internal voltage generation circuit with the pulse of the third selection signal SEL<3> will be described hereinafter.

The first latch unit 131 may receive the reset signal RESET having a logic "low" level and the deep power-down signal DPD having a logic "low" level to latch the first flag signal FLAG<1> generated at the point of time "T15" because the first selection signal SEL<1> has a logic "high" level. As a result, the first latch unit 131 may generate the first flag signal FLAG<1> having a logic "high" level and the first internal reset signal IRSTB<1> having a logic "high" level.

The second latch unit 132 may receive the reset signal RESET having a logic "low" level and the deep power-down signal DPD having a logic "low" level to latch the second flag signal FLAG<2> generated at the point of time "T15" because the second selection signal SEL<2> has a logic "high" level. As a result, the second latch unit 132 may generate the second flag signal FLAG<2> having a logic "high" level and the second internal reset signal IRSTB<2> having a logic "high" level.

The third latch unit 133 may receive the reset signal RESET having a logic "low" level and the deep power-down signal DPD having a logic "low" level to generate the third flag signal FLAG<3> having a logic "high" level and the third internal reset signal IRSTB<3> having a logic "low" level because the third selection signal SEL<3> has a logic "low" level.

The fourth latch unit 134 may receive the reset signal RESET having a logic "low" level and the deep power-down signal DPD having a logic "low" level to latch the fourth flag signal FLAG<4> generated at the point of time "T15" because the fourth selection signal SEL<4> has a logic "high" level. As a result, the fourth latch unit 134 may generate the fourth flag signal FLAG<4> having a logic "low" level and the fourth internal reset signal IRSTB<4> having a logic "high" level.

The drive signal generator 30 may buffer the first to third flag signals FLAG<1:3> having a logic "high" level to generate the first to third drive signals DRVEN<1:3> having a logic "high" level and the fifth to seventh drive signals DRVEN<5:7> including pulses which are periodically created. In such a case, the fourth drive signal DRVEN<4> may be generated to have a logic "low" level and the eighth drive signal DRVEN<8> may be generated to have a logic "low" level.

The internal voltage driver 41 may turn on the first to third drivers in response to the first to third drive signals DRVEN<1:3> having a logic "high" level to generate the first internal voltage signal VINT1.

The internal voltage pumping unit 42 may turn on the first to third pumps in response to the fifth to seventh drive signals DRVEN<5:7> including pulses, which are periodically created, to pump the second internal voltage signal VINT2.

Next, a logic "low" level pulse of the fourth selection signal SEL<4> may be inputted at a point of time "T17" after the termination of the deep power-down mode, and an operation of the internal voltage generation circuit with the pulse of the fourth selection signal SEL<4> will be described hereinafter.

The first latch unit 131 may receive the reset signal RESET having a logic "low" level and the deep power-down signal DPD having a logic "low" level to latch the first flag signal FLAG<1> generated at the point of time "T16" because the first selection signal SEL<1> has a logic "high" level. As a result, the first latch unit 131 may generate the first flag signal FLAG<1> having a logic "high" level and the first internal reset signal IRSTB<1> having a logic "high" level.

The second latch unit 132 may receive the reset signal RESET having a logic "low" level and the deep power-down signal DPD having a logic "low" level to latch the second flag signal FLAG<2> generated at the point of time "T16" because the second selection signal SEL<2> has a logic "high" level. As a result, the second latch unit 132 may generate the second flag signal FLAG<2> having a logic "high" level and the second internal reset signal IRSTB<2> having a logic "high" level.

The third latch unit 133 may receive the reset signal RESET having a logic "low" level and the deep power-down signal DPD having a logic "low" level to latch the third flag signal FLAG<3> generated at the point of time "T16" because the third selection signal SEL<3> has a logic "high" level. As a result, the third latch unit 133 may generate the third flag signal FLAG<3> having a logic "high" level and the third internal reset signal IRSTB<3> having a logic "high" level.

The fourth latch unit 134 may receive the reset signal RESET having a logic "low" level and the deep power-down signal DPD having a logic "low" level to generate the fourth flag signal FLAG<4> having a logic "high" level and the fourth internal reset signal IRSTB<4> having a logic "low" level because the fourth selection signal SEL<4> has a logic "low" level.

The drive signal generator 30 may buffer the first to fourth flag signals FLAG<1:4> having a logic "high" level to generate the first to fourth drive signals DRVEN<1:4> having a logic "high" level and the fifth to eighth drive signals DRVEN<5:8> including pulses which are periodically created.

The internal voltage driver 41 may turn on the first to fourth drivers in response to the first to fourth drive signals DRVEN<1:4> having a logic "high" level to generate the first internal voltage signal VINT1.

The internal voltage pumping unit 42 may turn on the first to fourth pumps in response to the fifth to eighth drive signals DRVEN<5:8> including pulses, which are periodically created, to pump the second internal voltage signal VINT2.

An internal voltage generation circuit according to the embodiments may generate flag signals which are sequentially enabled after a deep power-down mode terminates and may sequentially activate a plurality of drivers or a plurality of pumps according to the flag signals. Thus, the power consumption of the internal voltage generation circuit may be reduced.

What is claimed is:

1. An internal voltage generation circuit comprising:
    a flag signal generator suitable for generating a first flag signal which is enabled after a first predetermined time from a moment that a deep power-down mode terminates and suitable for generating a second flag signal which is enabled after a second predetermined time from a moment that the first flag signal is enabled;
    a drive signal generator suitable for receiving the first and second flag signals to generate a first drive signal and a second drive signal and suitable for receiving a pre-oscillation signal in response to the first and second flag signals to generate a third drive signal and a fourth drive signal; and
    an internal voltage generator suitable for driving a first internal voltage signal in response to the first and second drive signals and suitable for pumping a second internal voltage signal in response to the third and fourth drive signals.

2. The circuit of claim 1, wherein the deep power-down mode is terminated when a deep power-down signal received by the flag signal generator is disabled.

3. The circuit of claim 1, wherein the first and second flag signals are disabled in the deep power-down mode.

4. The circuit of claim 1, wherein the flag signal generator includes:
    an internal oscillation signal generator suitable for receiving a deep power-down signal to generate an internal oscillation signal including pulses which are periodically created;
    a selection signal generator suitable for outputting a counted signal as a first selection signal and suitable for outputting the counted signal as a second selection signal after the first selection signal is outputted, the counted signal being generated when the number of the pulses of the internal oscillation signal inputted to the selection signal generator is equal to a predetermined number; and
    a latch unit suitable for latching the first and second selection signals to generate the first and second flag signals after the deep power-down mode terminates.

5. The circuit of claim 1, wherein the first flag signal is enabled when the number of the pulses of an internal oscillation signal inputted to the selection signal generator is equal to a predetermined number after the deep power-down mode terminates.

6. The circuit of claim 1, wherein the second flag signal is enabled when the number of the pulses of an internal oscillation signal inputted to the selection signal generator is equal to a predetermined number after the first flag signal is enabled.

7. The circuit of claim 4, wherein the internal oscillation signal generator includes:
    an enablement signal generator suitable for receiving the deep power-down signal to output a power supply voltage signal as an enablement signal; and
    an oscillator suitable for generating the internal oscillation signal including pulses, which are periodically created, in response to the enablement signal.

8. The circuit of claim 4, wherein the selection signal generator includes:
    a counter suitable for executing a counting operation in response to the pulses of the internal oscillation signal to generate the counted signal and suitable for executing the counting operation in response to a pulse of a first internal reset signal to generate a pre-decode signal;
    a decoder suitable for decoding the pre-decode signal to generate first and second decode signals; and
    a signal transmitter suitable for outputting the counted signal as the first selection signal when the first decode signal is generated and suitable for outputting the counted signal as the second selection signal when the second decode signal is generated.

9. The circuit of claim 8, wherein the signal transmitter includes:
a first signal transmitter suitable for inversely buffering the counted signal in response to the first decode signal to generate the first selection signal after the deep power-down mode terminates; and
a second signal transmitter suitable for inversely buffering the counted signal in response to the second decode signal to generate the second selection signal after the deep power-down mode terminates.

10. The circuit of claim 8, wherein the latch unit includes:
a first latch unit suitable for latching the first selection signal to generate the first flag signal after the deep power-down mode and to generate the first internal reset signal including a pulse which is created when the first flag signal is enabled; and
a second latch unit suitable for latching the second selection signal to generate the second flag signal after the deep power-down mode and to generate the second internal reset signal including a pulse which is created when the second flag signal is enabled.

11. The circuit of claim 10,
wherein the counter outputs the pre-decode signal that is counted when the pulse of the first internal reset signal is inputted to the counter; and
wherein the counter initializes the pre-decode signal and the counted signal when the pulse of the second internal reset signal is inputted to the counter.

12. An internal voltage generation circuit comprising:
an internal oscillation signal generator suitable for receiving a deep power-down signal for executing a deep power-down mode to generate an internal oscillation signal including pulses which are periodically created;
a selection signal generator suitable for outputting a counted signal as a first selection signal, suitable for outputting the counted signal as a second selection signal after the first selection signal is outputted, suitable for outputting the counted signal as a third selection signal after the second selection signal is outputted, and suitable for outputting the counted signal as a fourth selection signal after the third selection signal is outputted, the counted signal being generated when the number of the pulses of the internal oscillation signal inputted to the selection signal generator is equal to a predetermined number;
a latch unit suitable for latching the first to fourth selection signals to generate first to fourth flag signals after the deep power-down mode terminates; and
a drive signal generator suitable for receiving the first to fourth flag signals to generate first to fourth drive signals for generating a first internal voltage signal and suitable for receiving the first to fourth flag signals to generate fifth to eighth drive signals for pumping a second internal voltage signal.

13. The circuit of claim 12, wherein the internal oscillation signal generator includes:
an enablement signal generator suitable for receiving the deep power-down signal to output a power supply voltage signal as an enablement signal; and
an oscillator suitable for generating the internal oscillation signal including pulses, which are periodically created, in response to the enablement signal.

14. The circuit of claim 12, wherein the selection signal generator includes:
a counter suitable for generating the counted signal enabled when first and second pre-counted signals has a predetermined logic combination and suitable for executing a counting operation in response to a control signal to generate first and second pre-decode signals, the first and second pre-counted signals being generated when the counting operation is executed in response to the pulses of the internal oscillation signal;
a decoder suitable for decoding the first and second pre-decode signal to generate first to fourth decode signals; and
a signal transmitter suitable for outputting the counted signal as the first selection signal when the first decode signal is generated, suitable for outputting the counted signal as the second selection signal when the second decode signal is generated, suitable for outputting the counted signal as the third selection signal when the third decode signal is generated, and suitable for outputting the counted signal as the fourth selection signal when the fourth decode signal is generated.

15. The circuit of claim 14, wherein the counter includes:
a first counter suitable for initializing the first and second pre-counted signals in response to an initialization signal and suitable for outputting the first and second pre-counted signals that are counted in response to the pulses of the internal oscillation signal;
a logic unit suitable for generating the counted signal enabled when the first and second pre-counted signals have a predetermined level combination; and
a second counter suitable for initializing the first and second pre-decode signals in response to the initialization signal and suitable for outputting the first and second pre-decode signals that are counted in response to pulses of the control signal.

16. The circuit of claim 15, wherein the latch unit includes:
a first latch unit suitable for latching the first selection signal to generate the first flag signal after the deep power-down mode and to generate a first internal reset signal including a pulse which is created when the first flag signal is enabled;
a second latch unit suitable for latching the second selection signal to generate the second flag signal after the deep power-down mode and to generate a second internal reset signal including a pulse which is created when the second flag signal is enabled;
a third latch unit suitable for latching the third selection signal to generate the third flag signal after the deep power-down mode and to generate a third internal reset signal including a pulse which is created when the third flag signal is enabled; and
a fourth latch unit suitable for latching the fourth selection signal to generate the fourth flag signal after the deep power-down mode and to generate a fourth internal reset signal including a pulse which is created when the fourth flag signal is enabled.

17. The circuit of claim 16, wherein the counter further includes:
a control signal generator suitable for generating the control signal including a pulse which are created when a pulse of at least one of the first to third internal reset signals is inputted; and
an initialization signal generator suitable for generating the initialization signal which is enabled when a reset signal or the pulse of the fourth internal reset signal is inputted in an initialization mode, wherein the reset signal is enabled in an initialization mode.

18. The circuit of claim 14, wherein the signal transmitter includes:
- a first signal transmitter suitable for inversely buffering the counted signal in response to the first decode signal to generate the first selection signal after the deep power-down mode terminates; and
- a second signal transmitter suitable for inversely buffering the counted signal in response to the second decode signal to generate the second selection signal after the deep power-down mode terminates;
- a third signal transmitter suitable for inversely buffering the counted signal in response to the third decode signal to generate the third selection signal after the deep power-down mode terminates; and
- a fourth signal transmitter suitable for inversely buffering the counted signal in response to the fourth decode signal to generate the fourth selection signal after the deep power-down mode terminates.

19. An internal voltage generation circuit comprising:
- a flag signal generator suitable for generating a first flag signal which is enabled after a first predetermined time from a moment that a deep power-down mode terminates and suitable for generating a second flag signal which is enabled after a second predetermined time from a moment that the first flag signal is enabled;
- a drive signal generator suitable for receiving the first and second flag signals to generate a first drive signal and a second drive signal and suitable for receiving a pre-oscillation signal in response to the first and second flag signals to generate a third drive signal and a fourth drive signal; and
- an internal voltage generator suitable for sequentially activating a plurality of drivers in response to the first and second drive signals and suitable for sequentially activating a plurality of pumps in response to the third and fourth drive signals.

20. An internal voltage generation circuit comprising:
- a flag signal generator suitable for sequentially generating and enable flag signals after a deep power-down mode terminates;
- a drive signal generator suitable for receiving the flag signals and to generate drive signals based on a number of received said flag signals, and suitable for receiving a pre-oscillation signal in response to the number of received said flag signals to generate additional drive signals; and
- an internal voltage generator suitable for activating a number of drivers in response to the number of received said flag signals, and suitable for activating a number of pumps in response to the number of received additional drive signals.

* * * * *